INVENTORS
MATTHIAS J.J. THEUNISSEN
WILHELMUS H.C.G. VERKUIJLEN
BY
AGENT.

INVENTORS
MATTHIAS J.J. THEUNISSEN
WILHELMUS H.C.G. VERKUIJLEN
BY

AGENT.

United States Patent Office 3,677,846
Patented July 18, 1972

3,677,846
MANUFACTURING SEMICONDUCTOR DEVICES

Matthias Johannes Joseph Theunissen and Wilhelmus Henricus Cornelis Gerardus Verkuijlen, Emmasingel, Eindhoven, Netherlands, assignors to U.S. Philips Corporation, New York, N.Y.

Filed May 4, 1970, Ser. No. 34,488
Claims priority, application Netherlands, May 7, 1969, 6907023
Int. Cl. H01l 7/50, 7/52
U.S. Cl. 156—8 1 Claim

ABSTRACT OF THE DISCLOSURE

A method of manufacturing a plurality of semiconductor devices from one plate-shaped semiconductor body in which one side of a plate-shaped semiconductor substrate is covered with a zone of semiconductor material said zone consisting, at least at the boundary with the underlying substrate of a semiconductor material differing from the adjoining substrate material in its composition and/or conductivity properties, the substrate being then removed by means of a selective electrolytic etching process while maintaining said zone, the zone being furthermore divided into separate, individual wafers of semiconductor material, characterized in that prior to the electrolytic etching process grooves are provided in the zone, the depth of said grooves being smaller than the thickness of the zone, so that after the electrolytic etching process the semiconductor material of the zone remains coherent and the division into the separate wafers is obtained by a chemical etching process from the side of the substrate.

Figure 1:
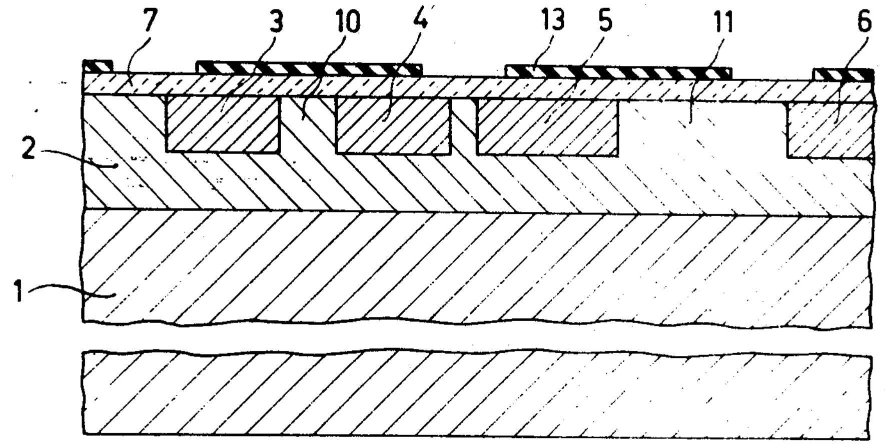

The invention relates to a method of manufacturing a plurality of semiconductor devices from one plate-shaped semiconductor body in which one side of a plate-shaped semiconductor substrate, is covered with a zone of semiconductor material, said zone consisting, at least at the boundary with the underlying substrate, of a semiconductor material differing from the adjacent substrate material in its composition and/or conductivity properties the substrate being then removed by means of a selective electrolytic etching process while maintaining said zone, the zone being furthermore divided into separate individual wafers of semiconductor material. The invention furthermore relates to a semiconductor device thus manufactured.

Various methods of manufacturing semiconductor devices are already known in which material is removed from one side of plate-shaped monocrystalline semiconductor bodies having a thickness, for example, of the order of from 100 to 200$\mu$, so as to obtain monocrystalline semiconductor material of a very small thickness, for example, in the order of from 10 to 20$\mu$. Said very thin semiconductor plates can be divided into wafers of smaller dimensions, which wafers can be used separately.

For thinning a semiconductor plate, grinding and/or polishing operations may be used in known manner. The difficulty presents itself that, even with a very small curvature of the plate, large differences in thickness of the thinned plate may result. Furthermore, lattice defects may be present in the monocrystalline material due to the mechanical operations, which defects, in the present cases of small thicknesses, may extend easily from one side of the plate-shaped material to the other.

Alternatively, chemical etching methods may be used but in these methods also very small differences in etching rate may produce comparatively large differences in thickness. Thus, in the case of an even thin-etching comparatively small differences in thickness in the original plate mean an increase of a large comparative difference in thickness. For example, in the case of etching down to approximately one tenth of the original thickness, there is approximately a ten-fold comparative difference. The words "comparative" and "comparatively" in this case relate to a comparison with the average thickness of the plate.

In order to obtain a more uniform thickness on one side of a substrate, methods are known in which a zone extending along the surface is formed. The zone consists of at least at the boundary with the underlying substrate, a semiconductor material and the material differs in electrical properties from the substrate material. The substrate is then removed by means of a selective electrolytic etching process while maintaining said zone. Such a thin zone with a uniform thickness can actually be obtained with known methods. It is known, for example, to provide in a semiconductor body of a given conductivity type a zone of a uniform thickness of the opposite conductivity type by diffusion of a suitable impurity and then to remove the underlying material of the original conductivity type of the body by means of a selective electrolytic etching process.

According to other known methods, such a zone is formed by providing on a monocrystalline semiconductor plate an epitaxial layer of another semiconductor material or of the same semiconductor material with other conductivity properties. In the case of a suitable choice of the substrate and the epitaxial zone, the material of the substrate can be removed by means of a selective electrolytic etching process, the etching action being discontinued when the boundary with the provided zone is reached. It is known, for example, to subject a semiconductor body of p-type or low-ohmic n-type semiconductor material, for example, germanium or silicon, with an epitaxial zone of the same semiconductor material but of high-ohmic n-type provided thereon, to a selective electrolytic etching treatment. It is also known to provide epitaxially a zone of monocrystalline cadmium sulphide on a monocrystalline body of germanium and to remove the germanium by a selective electrolytic etching process. In all these cases a very thin semiconductor plate of uniform thickness can be obtained.

For manufacturing a plurality of semiconductor devices comprising semiconductor wafers of small lateral dimensions from one very thin semiconductor plate said plate has to be divided into separate wafers. Usual processes such as scratching and breaking are less suitable in case of plates of the above described type having very small thicknesses.

In experiments for simultaneously thinning a semiconductor plate and dividing said plate in separate wafers preceding the present invention it has been found that the use of an electrolytic etching process in which the etching down is discontinued locally when the electric contact between the semiconductor material locally surrounded by the grooves and the electric connection provided on the semiconductor body is interrupted when the bottoms of said surrounding grooves are reached, can result in differences in thickness in each resulting wafer. The above-mentioned advantage of a selective electrolytic etching process, that the etching process is discontinued when the boundary with the provided zone is reached, does not hold good either since the said zone boundary is not reached before the wafers are electrically insulated because the etching process reaches the grooves.

According to the invention, the method of the type mentioned in the preamble is characterized in that, prior to the electrolytic process, grooves are provided in the zone, the depth of said grooves being smaller than the thickness of the zone, so that after the electrolytic etching process the semiconductor material of the zone remains coherent and the division into the separate wafers is obtained by a chemical etching process from the side of the substrate. With the selective electrolytic etching process, etching is carried out first until the zone boundary is reached, the thickness of the remaining material being determined by the thickness of the zone. Since the grooves do not reach the zone boundary, the electrolytic etching cannot be interrupted prematurely by the insulating action of the grooves. Since the chemical etching process is not carried out from the lower side of the substrate, but first from the zone boundary, that is to say, after the thickness has already become very small, the possibility of noticeable variations in the ultimate thickness of the semiconductor material by the chemical etching treatment becomes much smaller, while variations in thickness in the original substrate are eliminated by the selective electrolytic etching treatment. The reduction in thickness of the wafers to be formed by the chemical etching process is not limited by reaching the bottom of the shallow grooves.

Due to the accuracy with which a uniform very small thickness of the wafers can be obtained, the method according to the invention is particularly suitable for semiconductor structures in a very thin zone of a semiconductor material, junctions between regions of different conductivity types extending transverse to the zone from one side to the other side thereof. Such structures are known as flatland structures. The small surface area of the above junctions with corresponding small capacitance is an advantage in semiconductor devices for use at very high frequencies.

According to a preferred embodiment of the method according to the invention, in which, in the zone, local regions of different conductivity which remain at some distance from the boundary of the zone with the substrate are formed, the chemical etching process is continued until the material between such a region and the said boundary is removed.

In order that the invention may be readily carried into effect, it will now be described in greater detail, by way of example, with reference to the accompanying drawing, the FIGS. 1 to 5 are diagrammatic cross-sectional views showing in detail successive stages of the manufacture of semiconductor devices starting from a substrate body in the form of a slice.

Starting material is a slice of a semiconductor body 1 of n-type silicon having a resistivity of 0.007 ohm cm. doped with arsenic (see FIG. 1). The semiconductor slice has a diameter of, for example, 2 cm. and a thickness of approximately 300$\mu$. The slice 1 has been obtained from a rod-shaped single crystal of silicon by sawing transverse to the longitudinal direction of said crystal, after which the surface is further ground down to the thickness stated. The slice 1 is then pre-treated in known manner, in which one side is polished with fine-granular aluminium oxide and etched with gaseous HCl which is mixed with hydrogen. In the last treatment the slice is heated at approximately 1100° C. This slice forms the substrate for the zone 2 of different conductivity to be provided. The zone 2 is provided epitaxially in known manner onto one side of the body, the material of the zone consisting of n-type silicon having a resistivity of 0.5 ohm cm. The epitaxial zone 2 can be obtained, for example, by passing a gas mixture of silicon tetrachloride and hydrogen, to which a small amount of antimony hydride has been added, along the silicon slice 1, said slice being provided on a support with one side and being heated at a temperature of 1050° C. The epitaxial deposition is continued for 10 minutes, a zone thickness of 10$\mu$ being obtained.

By means of planar diffusion methods, regions of different conductivity type and/or conductivity are then provided, which regions, however, remain separated from the boundary with the substrate body 1 by the epitaxial material of the original conductivity type and conductivity. For example, p-type regions 3, 4, 5 and 6, having a thickness of approximately 3$\mu$ can be provided by planar boron diffusion in known manner. After this diffusion treatment the surface of the epitaxial zone will be covered with oxide. This oxide originates partly from the masking of silicon oxide used, partly from the oxygen present in the boron diffusion, for example, in the form of boron oxide or of oxygen or water vapour in the surrounding atmosphere, as is known per se in planar methods. It is also known to remove the oxide film after the applied diffusion processes and to form a new oxide film by superficial oxidation of the silicon.

In addition, contacts can be provided on the oxide in known manner via windows and/or capacitively controlling contacts and conductive strips (not shown in the figures) may be applied. The p-type regions 3 and 4 and the intermediate n-type region 10 may be used for forming an insulated gate field effect transistor (the gate electrode to be provided, for example, on the oxide film above the region 10) and the p-type region 5 with the adjacent n-type region 11 may be used for forming a diode. In order to enable the separation into wafers the etchant-resistant masking pattern 13, for example, of a photoresist material, is formed in known manner by means of photographic methods, the surface of the oxide layer 7 being exposed at the area of the shallow grooves to be provided. Now the stage shown in FIG. 1 is reached.

Figure 2:
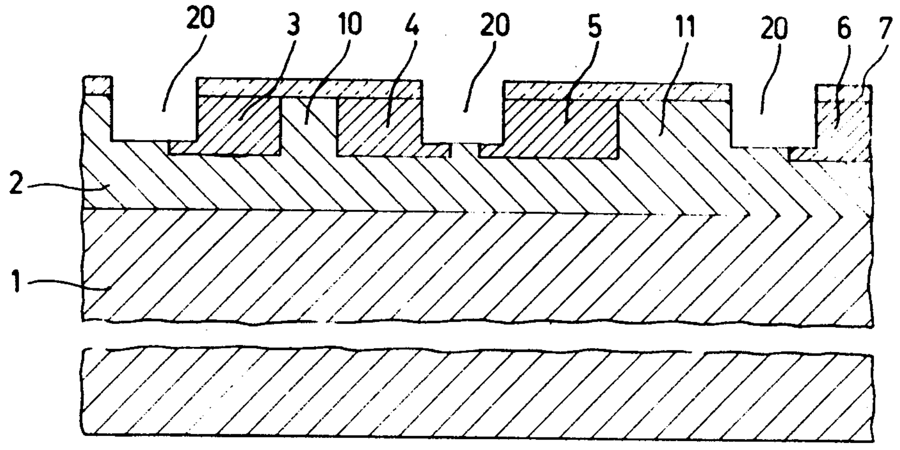

The surface on the side of the zone 2 is then subjected to a chemical etching treatment for forming the grooves 20 (see FIG. 2). For removing unmasked oxide, an etching treatment is previously used with a mixture of 1 part by volume of concentrated hydrofluoric acid (48% by weight of HF) and 6 parts by volume of a solution of ammonium fluoride in water (40% by weight of $NH_4F$).

For etching the grooves 20 in the silicon, an etching liquid is used which has been obtained by mixing 6 parts by volume of concentrated hydrofluoric acid with a previously prepared mixture of 10 parts by volume of concentrated nitric acid (65% by weight), 10 parts by volume of glacial acetic acid (98% by weight) and a quantity of iodine corresponding to 0.05 g. per ml. of the concentrated nitric acid. The body is treated in said etching bath for a short period of time (approximately 8 seconds), the grooves 20 being formed with a depth of approximately 2.5$\mu$. The bottom of said grooves still lie at a distance of approximately 7.5$\mu$ from the boundary of the zone 2 with the substrate 1. The etchant-resistant masking pattern can then be removed, if desirable. The resulting stage is diagrammatically shown in FIG. 2.

Figure 3:
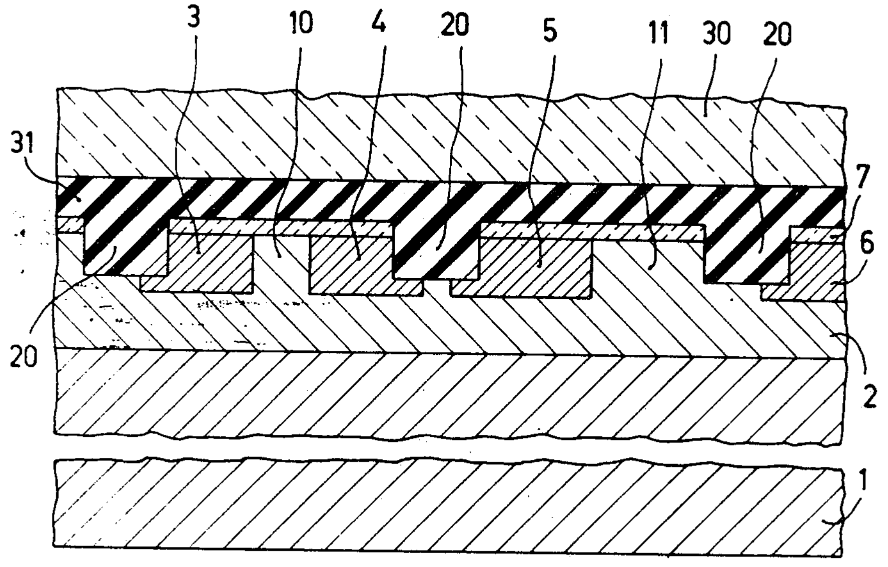

The substrate 1 of the resulting structure must now be removed. For that purpose, the assembly is first adhered, with the side of the epitaxial zone 2 and the grooves 20 provided therein, to a support 30 consisting of a quartz glass plate by means of a suitable etchant resistant and water-repellent cement 31, for example, colophonium. The resulting stage is shown in FIG. 3.

The substrate 1 is then removed by means of an electrolytic etching process as described in U.S. patent specification No. 3,616,345 to which reference is made for further details. Near its edge, the substrate slice 1 is connected to a platinum contact which is connected to the positive terminal of a direct voltage source. The electrolyte bath consists of dilute hydrofluoric acid obtained by mixing 1 part by volume of concentrated hydrofluoric acid with 10 parts by volume of water. An electrode of platinum gauze is provided in the electrolyte and is connected to the negative terminal of the direct voltage source. A voltage of 12 volts is set up between the platinum electrode in the bath and the platinum contact on the substrate 1.

The slice with the glass plate is now slowly dipped in vertical position, with the platinum contact upwards, into the electrolyte bath so that etching down of the substrate starts at the parts of the substrate most remote from the platinum contact.

Figure 4:
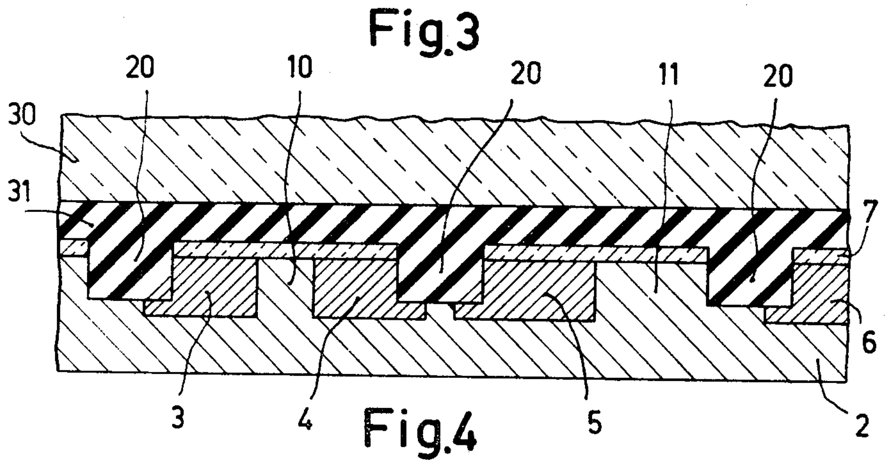

The substrate slice 1 is now etched from the side opposite to the epitaxial zone 2, at a rate of approximately 2$\mu$ per minute. Only the low-ohmic silicon of the substrate 1 is removed. As soon as the electrolyte contacts the epitaxial zone 2 of higher-ohmic n-type material at the boundary with the original substrate material due to the removal of said substrate material, a passivating film is formed on the silicon surface at that area, etching down of the higher-ohmic n-type material of the zone 2 being prevented. The stage shown in FIG. 4 is now reached, the epitaxial zone 2 being maintained in its original thickness of 10$\mu$ (the zone parts situated below the grooves 20) being thinner, of course.

A chemical etching treatment is then used for the further thin-etching of the semiconductor material. For that purpose, a slowly etching liquid may be used the composition of which can be obtained by dissolving 200 mgms. of $KMnO_4$ in 50 mls. of concentrated hydrofluoric acid and 50 mls. of glacial acetic acid. The etching rate of this liquid is 0.2$\mu$ per minute. The zone 2 is evenly etched and, thus the bottom of the grooves 20 and diffusion regions 3, 4, 5 and 6 are reached. The zone 2 is divided by the originally provided grooves 20 into separate wafers 40 of semiconductor material. After the bottom of the grooves 20 has been reached, the etching treatment is continued for another few minutes, after which the wafers 40 have obtained a thickness of only 2$\mu$. In these wafers so-called flat land structures have been obtained with regions of different conductivity type and/or different conductivity, which regions extend from one flat side of such a wafer to the other side and adjoin each other with junctions of a small area which extend transverse to the flat sides of such wafer.

Figure 5:
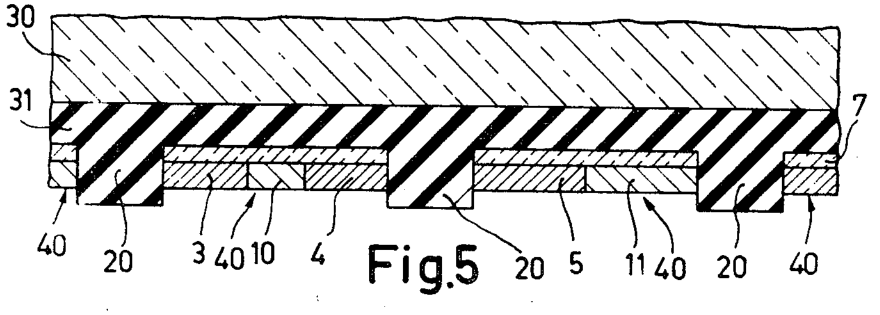

FIG. 5 shows a wafer in which the p-conductive region 5 formed by diffusion of boron adjoins only with a transverse p-n junction, the region 11 consisting of the epitaxially provided n-type material with its original doping. A flat land structure is otbained for a diode suitable for use at high frequencies.

Another wafer consists of p-type regions 3 and 4 formed by diffusion of boron, with the intermediate region 10 of n-type material as was originally provided epitaxially. This flat land structure is suitable for constructing an insulated gate field effect transistor in which the regions 3 and 4 form the source and drain electrodes and the region 10 forms the gate region. On one or both sides of said gate region an insulating layer and thereon a gate electrode should be provided, or, at least on one side, be provided already previously.

The wafers 40 are removed from the glass support 30 by dissolving the cement 31, for example, in trichloroethene. In spite of their very low thickness the separate wafers can readily be handled, for example, with a suction pipette, and it is found that they can readily be subjected to operations such as thermo compression bonding.

The above-described embodiment of the method according to the invention as described with reference to the figures can be varied in various manners. It is possible, for example, to obtain other flat land structures, for example, instead of a p-n-p structure for an enhancement mode field effect transistor an $n^+nn^+$ depletion mode field effect transistor.

Instead of an epitaxial zone of n-type silicon, an epitaxial zone of p-type silicon can also be used, provided that during the provision of said zone, at the boundary between the low ohmic n-type silicon of the substrate and the provided p-type material a high-ohmic n-type layer is formed diffusion, said layer having a thickness sufficient to protect the epitaxially provided material during the selective electrolytic etching of the substrate.

Furthermore it is possible in principle to use epitaxial n-type silicon on a p-type substrate.

What is claimed is:

1. A method of manufacturing a plurality of separate semi-conductor wafers from a single plate-shaped slice of semiconductor material, which comprises: (a) epitaxially growing on a surface of said slice a layer of semiconductor material of a different conductivity than that of said slice; (b) providing regions of different conductivity in said layer by planar diffusion, which regions are maintained separate from the boundary of said layer and said slice by the epitaxial material of said layer; (c) providing a predetermined etchant-resistant masking pattern on the surface of an oxide coating remaining on the surface of the layer; (d) removing the unmasked oxide coating by etching; (e) forming grooves between the sides of said layer and said regions of different conductivity to a predetermined depth which depth is less than the thickness of said layer; (f) removing said slice by an electrolytic etching process; (g) thin-etching said layer from the surface of said layer that was adjacent said slice until at least the bottom of said grooves are reached; and (h) separating said wafers from each other.

References Cited

UNITED STATES PATENTS

| | | | |
|---|---|---|---|
| 3,391,023 | 7/1968 | Frescura | 156—17 X |
| 3,372,063 | 3/1968 | Suzuki et al. | 156—17 X |
| 3,423,823 | 1/1969 | Ansley | 156—17 UX |
| 3,449,825 | 6/1969 | Loro | 156—17 UX |
| 3,493,820 | 2/1970 | Rosvold | 156—17 X |
| 3,540,955 | 11/1970 | Koger | 156—17 |
| 3,575,740 | 4/1971 | Castrucci et al. | 156—17 X |
| 3,088,888 | 5/1963 | Leff | 156—17 X |

OTHER REFERENCES

IBM Technical Disclosure Bulletin, Integrated Circuit Package by R. S. Schwartz, vol. 3, No. 12, May 1961, pp. 26 and 27.

WILLIAM A. POWELL, Primary Examiner

U.S. Cl. X.R.

156—17